US008912435B2

(12) United States Patent
Wachi et al.

(10) Patent No.: US 8,912,435 B2
(45) Date of Patent: Dec. 16, 2014

(54) ORGANIC PHOTOELECTRIC CONVERSION ELEMENT

(75) Inventors: Ayako Wachi, Tokyo (JP); Takahiko Nojima, Tokyo (JP); Yasushi Okubo, Tokyo (JP); Hiroaki Itoh, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 19 days.

(21) Appl. No.: 13/514,328

(22) PCT Filed: Dec. 1, 2010

(86) PCT No.: PCT/JP2010/071453
§ 371 (c)(1), (2), (4) Date: Jun. 7, 2012

(87) PCT Pub. No.: WO2011/074411
PCT Pub. Date: Jun. 23, 2011

(65) Prior Publication Data

US 2012/0241003 A1 Sep. 27, 2012

(30) Foreign Application Priority Data

Dec. 14, 2009 (JP) ................................ 2009-282575

(51) Int. Cl.

| | |
|---|---|
| *H01L 31/00* | (2006.01) |
| *H01L 51/42* | (2006.01) |
| *H01L 51/44* | (2006.01) |
| *H01L 51/00* | (2006.01) |

(52) U.S. Cl.
CPC ........ *H01L 51/4246* (2013.01); *H01L 51/4273* (2013.01); *H01L 51/441* (2013.01); *H01L 51/0036* (2013.01); *H01L 51/0037* (2013.01); *H01L 51/0053* (2013.01); *H01L 51/0072* (2013.01); *H01L 51/0073* (2013.01); *H01L 2251/308* (2013.01); *Y02E 10/549* (2013.01)
USPC ........................................................ 136/263

(58) Field of Classification Search
USPC ........................................................ 136/263
See application file for complete search history.

(56) References Cited

U.S. PATENT DOCUMENTS

| | | | | |
|---|---|---|---|---|
| 6,911,595 | B2 * | 6/2005 | Yoshikawa et al. | 136/263 |
| 7,026,041 | B2 | 4/2006 | Forrest et al. | |
| 2007/0131278 | A1 * | 6/2007 | Liu | 136/263 |
| 2007/0144579 | A1 | 6/2007 | Jung et al. | |
| 2007/0228356 | A1 * | 10/2007 | Makiura et al. | 257/13 |
| 2008/0264475 | A1 * | 10/2008 | Ito et al. | 136/252 |
| 2010/0187508 | A1 * | 7/2010 | Herron et al. | 257/40 |

FOREIGN PATENT DOCUMENTS

| | | | |
|---|---|---|---|
| JP | 2008-109112 | 5/2008 | |
| JP | 2008-247943 | * 10/2008 | 136/252 |
| JP | 2009-534853 | 9/2009 | |
| WO | WO2010110164 | * 9/2010 | |

OTHER PUBLICATIONS

English translation of WO20100110164, Mar. 2005, 2014.*

* cited by examiner

*Primary Examiner* — Jeffrey T Barton
*Assistant Examiner* — Uyen Tran
(74) *Attorney, Agent, or Firm* — Lucas & Mercanti, LLP

(57) ABSTRACT

Disclosed is an organic photoelectric conversion element which has excellent photoelectric conversion efficiency and excellent temperature stability with respect to power generation. The organic photoelectric conversion element comprises at least one photoelectric conversion layer and at least one carrier transport layer between a first electrode and a second electrode, and is characterized in that the carrier transport layer contains the salt of an alkali metal or an alkaline earth metal or the complex thereof of an alkali metal or an alkaline earth metal.

6 Claims, 1 Drawing Sheet

ORGANIC PHOTOELECTRIC CONVERSION ELEMENT

CROSS REFERENCE TO RELATED APPLICATION

Figure 1:
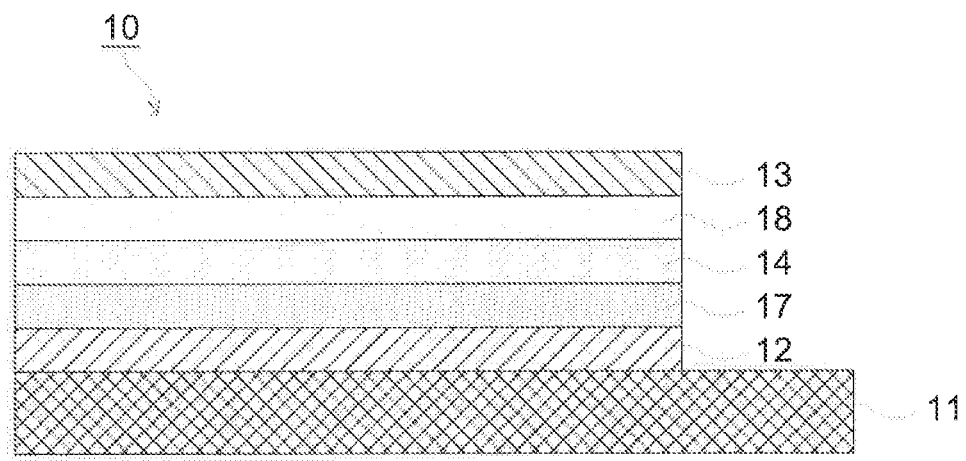

This Application is a 371 of PCT/JP2010/071453 filed on Dec. 1, 2010 which, in turn, claimed the priority of Japanese Patent Application No. 2009-282575 filed on Dec. 14, 2009, both applications are incorporated by reference herein.

TECHNICAL FIELD

The present invention relates to an organic photoelectric conversion element, particularly the organic photoelectric conversion element improved in temperature stability during power generation.

BACKGROUND

Since the organic thin film solar cell can be produced easily via a coating process under atmosphere or inert environment, it is expected to be a solar cell of next generation to drastically reduce power generation cost from the conventional silicon based solar cell. After provision of a bulk heterojunction type photoelectric conversion layer forming micro phase separation of a p-type organic semiconductor and an n-type organic semiconductor, remarkable technical progress has been recognized in improvement of the photoelectric conversion efficiency. A bulk heterojunction type organic solar cell (an organic photoelectric conversion element) has characteristics of charge separation with relatively high efficiency before deactivation of the exciton formed by light absorption, there is a problem to cause reduction of photoelectric conversion efficiency due to recombination of a part of free carriers having different charge since the generated free carrier occurs charge transfer in the bulk heterojunction layer by micro phase separation of an organic donor material or an organic acceptor material respectively.

As a countermeasure to the above problems, a technology improving photoelectric conversion efficiency by providing an exciton block layer proposed between the photoelectric conversion layer and the electrode to inhibit carrier recombination on an electrode is proposed (for example, Patent Document 1), and a technology improving photoelectric conversion efficiency by adding an aromatic compound containing an anion and a cation in a carrier transport layer provided between an electrode and power generation layer (for example, Patent Document 2).

However as a result of earnest study by the inventors it is recognized that, separation power of a reverse carrier is low by the carrier transport layer formed via the coating process described above, and recombination among free carriers having different charge on an electrode is not sufficiently inhibit. Further, it is recognized that efficiency reduces when it is stored at high temperature, and there is temperature dependence during power generation.

PRIOR ART REFERENCE

Patent Documents

Patent Document 1 U.S. Pat. No. 7,026,041
Patent Document 2 U.S. 2007/0144579 A1

SUMMARY OF THE INVENTION

Problems to be Dissolved by the Invention

The invention was accomplished to dissolve the problems, and the object of the invention is to provide an organic photoelectric conversion element which has excellent photoelectric conversion efficiency and excellent temperature stability with respect to power generation.

Technical Means to Dissolve the Problems

The problems are dissolved by the following embodiments.
1. An organic photoelectric conversion element comprising at least one photoelectric conversion layer and at least one carrier transport layer between a first electrode and a second electrode, wherein the carrier transport layer contains a salt of an alkali metal or an alkaline earth metal, or a complex of an alkali metal or an alkaline earth metal.
2. The organic photoelectric conversion element of item 1, wherein the carrier transport layer is an electron transport layer.
3. The organic photoelectric conversion element of item 1 or 2, wherein concentration of the salt of the alkali metal or the alkaline earth metal or the complex thereof in the carrier transport layer has continuous gradient in thickness direction of the carrier transport layer.
4. The organic photoelectric conversion element of any one of items 1 to 3, wherein concentration of the salt of an alkali metal or an alkaline earth metal or the complex thereof in the carrier transport layer is arranged so as to have higher concentration toward an electrode adjacent to the carrier transport layer.
5. The organic photoelectric conversion element of any one of items 1 to 4, wherein the salt of the alkali metal or the alkaline earth metal is a salt of aliphatic carboxylic acid.
6. The organic photoelectric conversion element of any one of items 1 to 5, wherein the metal of the salt of the alkali metal or the alkaline earth metal is cesium, potassium or calcium.
7. The organic photoelectric conversion element of any one of items 1 to 6, wherein the carrier transport layer is formed via a wet process.

Advantage of the Invention

A photoelectric conversion element having high photoelectric conversion efficiency and excellent temperature stability during power generation can be provided by the present invention.

BRIEF DISCLOSURE OF DRAWING

Figure 2:
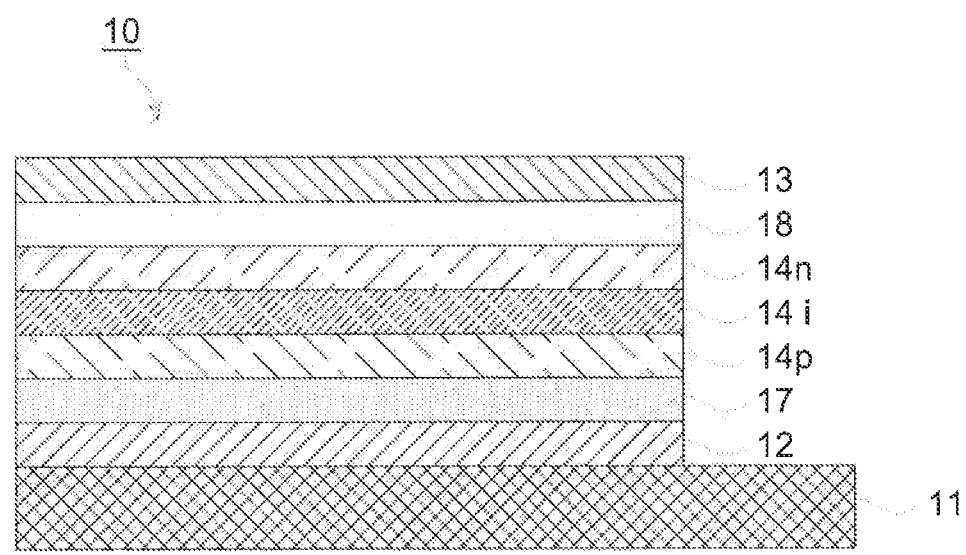

FIG. 1 shows a cross section view of a bulk heterojunction type organic photoelectric conversion element.
FIG. 2 shows a cross section view of an organic photoelectric conversion element provided with photoelectric conversion layers composed of p-i-n 3-layer configuration.

EMBODIMENT TO PRACTICE THE INVENTION

The inventors have found as a result of earnest study that selectivity of charge is improved and photoelectric conversion efficiency is improved by that in an organic photoelectric conversion element comprising a photoelectric conversion layer between a first electrode layer and a second electrode layer, and a carrier transport layer transporting mainly any charge of hole or electron between the photoelectric conversion layer and the first electrodes, or between the photoelectric conversion layer and the second between the electrodes, which is composed by that a salt of an alkali metal or an alkaline earth metal or a respective complex thereof is doped in a main component composing carrier transport layer, and further concentration of the salt of an alkali metal or an alkaline earth metal or the respective complex thereof has continuous gradient in thickness direction of the carrier transport layer. Further, also has found that film of the carrier transport layer is reinforced and reduction of photoelectric conversion efficiency of the element is suppressed even stored at high temperature by doping an organic compound salt of an alkali metal or an alkaline earth metal or a respective complex thereof into a carrier transport layer.

Here, the carrier transport layer is a transport layer transporting any of hole or electron, and a layer mainly transports hole is called a hole transport layer (HTL) and a layer mainly transports electron is called a an electron transport layer (ETL). A feature is that the carrier transport layer contains a salt of an alkali metal or an alkaline earth metal or a respective complex thereof in this invention.

In a preferable embodiment of the invention, it is preferable to have concentration gradient as the salt of an alkali metal or an alkaline earth metal or the respective complex thereof in the electron transport layer is contained more as closer to the electrode, and less as closed to the photoelectric conversion layer.

The inventors suppose the reason to obtain the advantage by the invention is as follows.

It is considered that hole and electron generated in the photoelectric conversion layer inhibits recombination on an electrode effectively, and improves charge taking out efficiency by changing blocking power to reverse charge (a hole when the layer is an electron transport layer) stepwise of continuously, in the organic photoelectric conversion element of the invention.

Further, it is recognized that deterioration of the element due to storage at high temperature is inhibited by employing the salt of an alkali metal or an alkaline earth metal or the respective complex thereof in the carrier transport layer as a result of the earnest study. This is supposed that film of the carrier transport layer is reinforced and inhibits peeling off of the metal electrode due to gas generated from volatile solvent during storage at high temperature by doping aliphatic metal salt, and therefore reduction of photoelectric conversion efficiency due to metal electrode peeling is dissolved.

The invention is described in detail.

Salt of Alkali metal or Alkaline Earth Metal or Respective Complex Thereof

A salt of an alkali metal or an alkaline earth metal or a respective complex thereof is considered to work as an n-type dopant in the invention. An n-type dopant is an impurity doped into a semiconductor, and electron is a carrier to transport charge.

Metal of the salt of an alkali metal of the invention is not particularly limited and includes sodium, potassium, lithium, cesium and the like, preferably potassium and cesium, and more preferably cesium.

A metal of the salt of an alkaline earth metal is not particularly limited and includes beryllium, magnesium, calcium, strontium barium and the like, and preferably is calcium.

Acid forming metal salt may be inorganic acid or organic acid.

Inorganic acid includes halogen acid such as hydrochloric acid, hydrobromic acid, and hydrofluoric acid, nitric acid phosphoric acid and the like.

Organic acid is not particularly limited and includes aliphatic carboxylic acid, aromatic carboxylic acid, aliphatic sulfonie acid, an aromatic sulfonic acid and the like, and preferable is organic carboxylic acid such as aliphatic or aromatic carboxylic acid.

Examples of the organic carboxylic acid include formic acid, acetic acid, propionic acid, butyric acid, valerianic acid, caproic acid, enanthic acid, caprylic acid, oxalic acid, malonic acid, succinic acid, benzoic acid, phthalic acid, isophthalic acid, terephthalic acid, salicylic acid, pyruvic acid, lactic acid, malic acid, adipic acid, mesylic acid and the like, and examples of organic sulfonic acid include tosyl acid, benzene sulfonic acid and the like.

Preferable examples of salts formed by alkali metal or alkaline earth metal with the acid or a respective complex thereof include formic acid salt, acetic acid salt, propionic acid salt, butyric acid salt, valerianic acid salt, caproic acid salt, enanthic acid salt, caprylic acid salt, oxalic acid salt, malonic acid salt, succinic acid salt, benzoic acid salt, more preferably formic acid salt, acetic acid salt, propionic acid salt, butyric acid salt and the like, and number of carbon atoms of aliphatic carboxylic acid is not more than 4.

Specific examples of preferable salt of an alkali metal or an alkaline earth metal include lithium formate, potassium formate, sodium formate, cesium format; lithium acetate, potassium acetate, sodium acetate, cesium acetate, lithium propionate, sodium propionate, potassium propionate, cesium propionate, lithium oxalate, sodium oxalate, potassium oxalate, cesium oxalate, lithium malonate, sodium malonate, potassium malonate, cesium malonate, lithium succinate, sodium succinate, potassium succinate, cesium succinate, lithium benzoate, sodium benzoate, potassium benzoate and cesium benzoate, more preferably lithium acetate, potassium acetate, sodium acetate and cesium acetate, and most preferably cesium acetate.

Examples of ligands to form the complex with alkali metal or alkaline earth metal include anmine, chloro, cyano, thiocyanato, acetylacetonate, ethylenediamine, glycinato, diethylenetriamine, ethylenediamine tetraacetato, dipyvaloylmethan and the like.

Preferable examples of the complex include lithium acetylacetonate, magnesium acetylacetonate, calcium acetylacetonate, sodium thiocyanate and potassium thiocyanate, and most preferably calcium acetylacetonate.

Concentration of n-type dopant affects durability or the like of element, and therefore content of the salt of an alkali metal or an alkaline earth metal or the respective complex thereof is preferably 1.5 to 35% by mass, more preferably 3 to 25% by mass, and most preferably 5 to 15% by mass with respect to carrier transport layer.

Carrier Transporting Layer

The invention is featured by containing the salt of an alkali metal or the alkaline earth metal or a respective complex thereof in a carrier transport layer. The salt of an alkali metal or the alkaline earth metal or a respective complex thereof may be distributed homogeneously in the carrier transport layer, and preferably is distributed with continuous gradient in a thickness direction, and more preferably concentration is arranged so as to have higher concentration toward adjacent electrode. Here, the adjacent electrode is a cathode in an electron transport layer, and an anode in a hole transport layer.

The salt of an alkali metal or the alkaline earth metal or the respective complex thereof can be added to a carrier transport layer by a method wherein the salt of an alkali metal or the alkaline earth metal or a respective complex thereof is added to a coating composition liquid to form a carrier transport layer, and forms by coating. The concentration gradient is formed by a method wherein a coating composition containing the salt of an alkali metal or the alkaline earth metal or a respective complex thereof in high concentration is coated on the carrier transport layer according to above described method, and allow to diffuse it.

Electron Transporting Layer

The electron transport layer which is one of carrier transport layers according to the invention is described.

Octazaporphyrin, a perfluoro p-type semiconductor (perfluoro pentacene, perfluoro phthalocyanine or the like) can be used in an electron transport layer, and similarly, a hole blocking function, which has a rectifying effect to prevent holes generated in the bulk heterojunction layer from flowing to cathode side, is imparted to the electron transport layer having deeper HOMO level than the HOMO level of p-type semiconductor material used in the bulk heterojunction layer. More preferably, materials having deeper HOMO level than that of n-type semiconductor are employed as the electron transport layer. Further, it is preferable to use compounds having high electron mobility in view of electron transporting characteristics.

The above-described electron transport layer is also called a hole block layer, and it is more preferable to use the electron transport layer which have such function. Examples of a material for that include a phenanthrene type compound such as bathocuproine; an n-type semiconductor material such as naphthalenetetracarboxylic acid anhydride, naphthalenetetracarboxylic acid diimide, perylenetetracarboxylic acid anhydride and perylenetetracarboxylic acid diimide; and an alkali metal compound which form a layer via coating such as titanium oxide. Further, a layer singly composed of an n-type semiconductor material which is used in a bulk heterojunction layer can be employed.

Methods to form an electron transport layer are not particularly limited and include preferably a wet process coating method such as a spin coat method, a casting method, a printing method including an inkjet method, an LB (Langmuir Blodgett) method, a die coat method and a spray method, and further preferably is a layer forming by a coating method such as a spin coat method, a die coat method, an inkjet method, a spray method, and printing method from the view point that unifonn layer is obtained with high productivity. Thickness of the electron transport layer is preferably 0.01 to 100 nm, more preferably 0.01 to 50 nm, and most preferably 0.1 to 10 nm.

Hole Transporting Layer

The hole transport layer, one of the carrier transport layers, is described.

As a material to constitute the aforesaid layers, there can be used for a hole transport layer, for example: PEDOT (product name Baytron™ made by Starck Vitec Co.), polyaniline and its dope material, and a cyano compound described in WO 06/019270. In addition, to the electron transport layer which has a LUMO level shallower than the LUMO level of the n-type semiconductor material used for a photoelectric conversion layer, there is provided an electron block function having a rectifying effect by which the electron generated in the photoelectric conversion layer is not passed to the anode side. The above-described hole transport layer is also called an electron block layer, and it is more preferable to use a hole transport layer having such function. Examples of these materials include: a triaryl amine compound described in JP-A No. 5-271166, a metal oxide such as molybdenum oxide, nickel oxide and tungsten oxide. Moreover, the layer which consists of a single substance of a p-type semiconductor material used for the photoelectric conversion layer can also be used. As a means to form these layers, although any one of a vacuum deposition method and a solution coating method can be used, it is preferably used the solution coating method. When a lower layer is formed with a coating method before forming a photoelectric conversion layer, it will have an effect of leveling the coating surface. This will result in decreasing a leaking effect and it is preferable.

Preferable configuration and composing element in the organic photoelectric conversion element of the invention are described in detail.

Configuration of Organic Photoelectric Conversion Element

FIG. 1 is a cross-sectional view showing a solar cell having an organic photoelectric conversion element of a bulk heterojunction type. In FIG. 1, organic photoelectric conversion element 10 of a bulk heterojunction type has a successively laminated structure on one surface of substrate 11, anode 12, hole transport layer 17, photoelectric conversion layer 14, electron transport layer 18 and cathode 13.

Substrate 11 is a member holding successively laminated members of: anode 12, photoelectric conversion layer 14 and cathode 13. In this embodiment, since the incident light by which photoelectric conversion is carried out enters from the substrate 11 side, the substrate 11 is a member which enables to pass through this light by which photoelectric conversion is carried out, i.e., it is a transparent member to the wave length of this light that should be carried out photoelectric conversion. As for substrate 11, a glass substrate and a resin substrate are used, for example. This substrate 11 is not indispensable. For example, organic photoelectric conversion element 10 of a bulk heterojunction type may be formed by forming anode 12 and cathode 13 on both surfaces of photoelectric conversion layer 14.

Photoelectric conversion layer 14 is a layer which converts light energy into electric energy, and it is composed of a photoelectric conversion layer which is constituted by mixing a p-type semiconductor material and an n-type semiconductor material. A p-type semiconductor material functions relatively as an electron donor (donor), and an n-type semiconductor material functions relatively as an electron acceptor (acceptor). Here, an electron donor and an electron acceptor are "an electron donor and an electron acceptor which form a pair of electron and hole (charge separation state) by transfer of an electron from an electron donor to an electron acceptor when a light is absorbed." That is, an electron is not donated or received like an electrode, but an electron is donated or received by a photoreaction.

In FIG. 1, the incident light entering to anode 12 through substrate 11 is absorbed by an electron donor or an electron acceptor in a photoelectric conversion layer of photoelectric conversion layer 14. An electron is transferred from the electron donor to the electron acceptor to form a pair of electron and hole (charge separation state). The generated electric charge is transported by an internal electric field, (for example, the electric potential difference of anode 12 and cathode 13 when the work function of the anode 12 and the cathode 13 are different). An electron passes through electron acceptors, while a hole passes through electron donors, and the electron and the hole each are respectively transported to a different electrode, and a photocurrent is detected. For example, when the work function of anode 12 is larger than the work function of cathode 13, the electron is transported to the anode 12 and the hole is transported to the cathode 13. In addition, if the size of a work function is reversed, the electron and the hole will be transported to the reverse direction to that described above. Moreover, the transportation direction of an electron and a hole is also controllable by applying a potential between the anode 12 and the cathode 13.

In addition, although not described in FIG. 1, it may possible to have other layers, such as a hole block layer, an electron block layer, an electron injection layer, a hole injection layer, or a smoothing layer.

More preferable structure is a structure in which the above-mentioned photoelectric conversion layer 14 is composed of three layered structure of so-called p-i-n structure. The usual photoelectric conversion layer is a single 14i layer containing a p-type semiconductor material and an n-type semiconductor material mixed with each other. By sandwiching 14i layer with 14p layer composed of a p-type semiconductor material single substance and 14n layer composed of an n-type semiconductor material single substance, the rectifying property of a hole and an electron becomes higher, the loss caused by the recombination of a hole and an electron which carried out charge separation is reduced, and still higher photoelectric conversion efficiency can be acquired by this structure.

Substrate

When the light by which photoelectric conversion is carried out enters from the substrate side, it is preferable that the substrate is made of a member enabling to transmit the light by which photoelectric conversion is carried out. That is, it is preferable that the substrate is made of a transparent member to the wave length of this light that should be carried out photoelectric conversion. A glass substrate or a resin substrate, for example, is suitably used as the substrate, and it is preferable to use a transparent resin film in view of lightness and flexibility. The transparent resin film used as a transparent substrate in the invention is not particularly limited and known materials having any shape, structure, thickness and the like is optionally selected. Specific examples of a resin film include: a polyester resin film such as polyethylene terephthalate (PET), polyethylene naphthalate (PEN) and modified polyester; a polyolefin resin film such as a polyethylene (PE) resin film, a polypropylene (PP) resin film, a polystyrene resin film and a cyclic olefin resin; a vinyl resin film such as polyvinylchloride and polyvinylidene chloride; a polyether ether ketone (PEEK) resin film, a polysulfone (PSF) resin film, a polyethersulfone (PES) resin film, a polycarbonate (PC) resin film, a polyamide resin film, a polyimide resin film, an acrylic resin film and a triacetyl cellulose (TAC) resin film. If the resin film exhibits transmittance for the light of a visible range (380 to 800 nm) is 80% or more, it is preferably applicable to the transparent resin film concerning the present invention. Especially, from the viewpoints of transparency, heat resistivity, ease of handling, strength and cost, the following resins are preferable: a biaxial stretched polyethylene terephthalate film, a biaxial stretched polyethylenenaphthalate film, a polyethersulfone film and a polycarbonate film. Among them, a biaxial stretched polyethylene terephthalate film and a biaxial stretched polyethylenenaphthalate film are more preferable.

In order to secure the wettability and the adhesion property of a coating solution, surface treatment can be performed and an adhesion assisting layer can be prepared to the transparent substrate used for the present invention. About surface treatment or an adhesion assisting layer, a known technique can be used conventionally. For example, as surface treatment, there can be cites a surface activation process such as corona discharge treatment, flame treatment, ultraviolet treatment, high-frequency treatment, glow discharge process, activity plasma treatment and laser process. Moreover, as an adhesion assisting layer, there can be cites polyester, polyamide, polyurethane, vinyl copolymer, butadiene copolymer, acrylic copolymer, vinylidene copolymer and epoxy copolymer.

In order to control transmission of oxygen and water vapor, a barrier coat layer may be formed beforehand to the transparent substrate, and a hard coat layer may be formed beforehand on the opposite side which is transferred a transparent conductive layer.

First Electrode

The first electrode can be selected, without specifying a cathode or an anode, according to the element structure. The preferable is an electrode which transmits light of 380 to 800 nm enabling light-electric conversion in a photoelectric conversion layer. Examples of a material used for that include: a transparent conductive metal oxide such as indium tin oxide (ITO), $SnO_2$ and ZnO; a metal thin film such as gold, silver and platinum; a metal nano-wire; a carbon nano-tubes; and a conductive polymer.

Second Electrode

As the second electrode, a counter electrode, usable are a metal such as example, gold, silver, copper, platinum, rhodium, ruthenium, aluminum, magnesium and indium; carbon; and material used for the first electrode, but not limitative.

Photoelectric Conversion Layer

The photoelectric conversion layer is a layer converting light energy to electric energy, and is composed of a bulk heterojunction layer mixing a p-type semiconductor material and an n-type semiconductor material homogeneously. The p-type semiconductor material works relatively as an electron donor (donor), and the n-type semiconductor material works relatively as an electron acceptor (acceptor). Here, the electron donor and the electron acceptor are "an electron donor and an electron acceptor by which electron transfers from the electron donor to the electron acceptor when light is absorbed, and forms a pair of hole and electron (charge separation state)", and do not donate or accept electron simply as an electrode does, but donate or accept electron via photoreaction.

As a p-type semiconductor material used for the present invention, various types of condensed polycyclic aromatic compounds and conjugated system compounds are cited.

Examples of a condensed polycyclic aromatic compound include: anthracene, tetracene, pentacene, hexacene, heptacene, chrysene, picene, fulminene, pyrene, peropyrene, perylene, terrylene, quoterylene, coronene, ovalene, circumanthracene, bisanthene, zethrene, heptazethrene, pyanthrene, violanthene, isoviolanthene, circobiphenyl, anthradithiophene and a derivative or a precursor thereof.

Examples of a conjugated system compound include: polythiophene and its oligomer, polypyrrole and its oligomer, polyaniline, polyphenylene and its oligomer, polyphenylene vinylene and its oligomer, poly thienylene vinylene and its oligomer, polyacethylene, polydiacetylene, a tetrathiafulvalene compound, a quinone compound, a cyano compound such as a tetracyanoquinodimethane, fullerene and a derivative thereof and a mixture thereof.

Among polythiophene and its oligomer, suitably used oligomers are thiophene hexamers such as α-sexithionene, α,ω-dihexyl-α-sexithionene, α,ω-dihexyl-α-quinquethionene, and α,ω-bis(3-butoxypropyl)-α-sexithionene.

In addition thereto, examples of polymer p-type semiconductor include polyacetylene, polyparaphenylene, polypyrrol, polyparaphenylenesulfide, polythiophene, polyphenylenevinylene, polycarbazole, polyisothianaphthene, polyheptadiin, polyquinoline, polyaniline and the like, and further, substituted-nonsubstituted alternative copoly thiophene disclosed in such as JPA 2006-36755, a polymer having condensed cyclic thiophene structure disclosed in such as JPA 2007-51289, JPA 2005-76030, J. Amer. Chem. Soc., 2007, p4112, and J. Amer. Chem. Soc., 2007, p7246 and a thiophene copolymer disclosed in WO2008/000664, Adv. Mater., 2007, p4160, and Macromolecules, 2007, Vol. 40, p1981.

Further, there can be used the following compounds: porphyrin, copper phthalocyanine; organic molecule complex such as tetrathiafulvalene (TTF)-tetracyanoquinodimethane (TCNQ) complex, bisethylenetetrathiafulvalene (BEDTTTF)-perchloric acid complex, BEDTTTF-Iodine complex, TCNQ-Iodine complex; fullerenes such as fullerene $C_{60}$, fullerene $C_{70}$, fullerene $C_{76}$, fullerene $C_{78}$, and fullerene $C_{84}$; carbon nano-tube such as SWNT; dyes such as merocyanine dye and hemicyanine dye; σ conjugated polymers such as polysilane and polygermane, and organic-inorganic mixed materials disclosed in JP-A No. 2000-260999.

As an n-type semiconductor material, for example, a fullerene derivative compound is used to realize relatively high photoelectric conversion efficiency.

Specific examples include: fullerene, octazaporphyrin, a perfluoro compound of a p-type semiconductor such as perfluoro pentacene and perfluorophthalocyanine, a polymer compound which contains an aromatic carboxylic acid anhydride and its imide in the structure, such as naphthalenetetracarboxylic anhydride, naphthalenetetracarboxylic diimide, perylenetetracarboxylic anhydride, and perylenetetracarboxylic diimide.

Among them, a polymer containing a fullerene compound is preferable. Examples of a polymer containing a fullerene compound include a polymer having the following fullerene in the structure: fullerene $C_{60}$, fullerene $C_{70}$, fullerene $C_{76}$, fullerene $C_{78}$, fullerene $C_{84}$, fullerene $C_{240}$, fullerene $C_{540}$, mixed fullerene, fullerene nano-tube, multi layer nano-tube, mono layer nano-tube, and nano-horn (cone type). As a polymer containing a fullerene compound, it is preferable a polymer compound (derivative) having fullerene $C_{60}$ in the structure.

For forming method of a bulk heterojunction layer in which an electron acceptor and an electron donor are mixed, coating method (containing a cast method and a spin coat method) and the like is cited.

The photoelectric conversion layer is subjected to annealing treatment at predetermined temperature during producing process to crystallize in microscopic state partly so as to improve conversion efficiency.

Optical Function Layer

The organic photoelectric conversion element of the present invention may be provided with a various types of optical function layers for the purpose of efficient light receiving of sunlight. As an optical function layer, there may be provided with an anti-reflection layer, a light condensing layer such as a microlens array, a light diffusion layer which can scatter the light reflected by the cathode and can make the light enter again in a power generation layer.

As an anti-reflection layer, known anti-reflection layer can be prepared. For example, when a transparent resin film is a biaxial stretched polyethylene terephthalate film, it is preferable to set the refractive index of the adhesion assisting layer, which is adjacent to the film, to be 1.57 to 1.63. This will improve transmittance with decreasing the interface reflection between the film substrate and the adhesion assisting layer. As a way of adjusting a refractive index, it can be carried out by adjusting suitably the ratio of a binder resin to oxide sol having a comparatively high refractive index such as a tin oxide sol and a cerium oxide sol and by coating it. Although a single layer of adhesion assisting layer may be sufficient, in order to raise adhesion property, a composition of two or more adhesion assisting layers may be used.

Examples of a light condensing layer are as follows: to set a structure of a micro lens array on the sunlight receiving side of the substrate; and to combine a so-called light condensing sheet to increase an amount of the receiving light from a specific direction, or conversely, to decrease incident angle dependability of sunlight.

As an example of a microlens array, it can be cited an arrangement in which the quadrangular pyramidal forms having a base of 30 μm and a vertex angle of 90 degrees are arranged in two dimensions on the light taking out side of a substrate. As for a base, the range of 10 to 100 μm is desirable. When it is smaller than this range, the effect of diffraction will occur to result in coloring, while when it is larger than this range, the thickness becomes large. They are not desirable.

Moreover, as a light scattering layer, a various types of anti-glare layers and a layer in which are distributed nanoparticles or nano-wire made of metal or various inorganic oxides in a colorless transparent polymer can be cited.

Patterning

There is no restriction in particular to the way and the process of patterning an electrode, a power generation layer, a hole transport layer and an electron transport layer, etc. concerning the present invention, and a known approach can be applied suitably.

In the case of a soluble material used for a bulk heterojunction layer and a transport layer, only a unnecessary part may be wiped off after the complete application with a die coat, or a dip coat, or it may be directly patterned at the time of an application using the methods such as an ink-jet method or a screen printing.

In the case of an insoluble material used for an electrode material, mask deposition can be performed at the time of vacuum deposition, or it can be patterned by the well-known methods such as etching or lift-off. Moreover, it may be formed a pattern by transferring the pattern formed on another substrate.

Sealing

In order to prevent deterioration of the produced organic photoelectric conversion element by oxygen or water existing in an ambient, it is preferable to carry out sealing with a known method. For example, the following methods can be cited: a method of carrying out sealing by pasting up the cap made of aluminum or glass with an adhesive agent; a method of adhering a plastic film in which a gas barrier layer made of aluminum, silicon oxide, or aluminum oxide has been formed, with an organic photoelectric conversion element with an adhesive agent; a method of spin coating a polymer material having a high gas barrier property (for example, polyvinyl alcohol); or a method of depositing under a vacuum condition an inorganic thin film (for example, silicon oxide and aluminum oxide).

EXAMPLE

The invention is described specifically by means of examples. The invention is not limited to these. The term of "part" or "%" means "part by mass" or "% by mass", otherwise specified.

Example 1

Manufacture of Organic Photoelectric Conversion Element SC-101

(Forming Transparent Electrode (First Electrode), and Hole Transport Layer)

After patterning ITO formed on glass, it was washed with synthetic detergent, ultrapure water, acetone and isopropanol respectively, and was subjected to UV ozone treatment. An aqueous dispersion of PEDOT-PSS (poly(3,4-ethylenedioxythiophene)-poly(styrenesulfonate)), BaytronP 4083, marketed by H.C. Starck GmbH was applied by a spin coater, subsequently was dried at 140° C. for 10 minutes. PEDOT-PSS layer having thickness of 30 nm was formed by adjusting rotation speed of the spin coater. The PEDOT-PSS layer was coated and dried in atmosphere ambient, and a substrate having a hole transport layer was formed.

The hole transport layer was formed in atmosphere ambient within a clean room, then was moved to a nitrogen glove box, and layers were formed after a photoelectric conversion layer.

(Forming Photoelectric Conversion Layer)

P3HT (Regioregular poly(3-hexylthiohene)), Mw of 52,000, high molecular weight of p-type semiconductor material, manufactured by Plextronics Inc.) and PCBM (Mw of 911, low molecular weight of n-type semiconductor material, 6,6-phenyl-$C_{61}$-butylic acid methylester, available from Frontier Carbon Corporation) were mixed in 1:1 so as to be 3% by mass, and were dissolved in chlorobenzene, stirred for 24 hours to prepare coating composition liquid of P3HT/PCBM.

P3HT/PCBM coating composition liquid was coated on the substrate having the hole transport layer formed as described above so as to have a layer thickness of 200 nm by employing a spin coater, and a photoelectric conversion layer was formed by drying at room temperature.

(Forming Electron Transport Layer)

Subsequently, the substrate having provided with a series of functional layers described above was moved to inside of a vacuum deposition apparatus chamber, pressure of inside of the vacuum deposition apparatus was reduced to $1 \times 10^{-4}$ Pa, lithium fluoride was layered at deposition speed of 0.01 nm/sec, so as to have a thickness of 0.6 nm, and an electron transport layer was formed.

(Forming Second Electrode)

Next, aluminum metal was layered through a shadow mask having widths of 2 mm orthogonally so that photoreceiving window had 2×2 mm, at deposition speed of 0.2 nm/sec to have a thickness of 100 nm, and a second electrode was formed. Thus obtained organic photoelectric conversion element SC-101 was moved to a nitrogen chamber, was sealed employing sealing cap and UV curable resin, and a sealed element having photo receiving window of 2×2 mm was manufactured.

(Baking Treatment)

The above described sealed element was subjected to anneal treatment on a hot plate at 150° C. for 10 minutes, and organic photoelectric conversion element SC-101 was obtained.

Manufacture of Organic Photoelectric Conversion Element SC-102

Organic photoelectric conversion element SC-102 was manufactured in a same way as organic photoelectric conversion element SC-101 except that the electron transport layer was formed by co-deposition of PyronineB and NTCDA shown later in a mixture mass ratio of 20:1 at deposition speed of 0.01 nm/sec to have a thickness of 5 nm.

Manufacture of Organic Photoelectric Conversion Element SC-103

Organic photoelectric conversion element SC-103 was manufactured in a same way as organic photoelectric conversion element SC-101 except that electron transport layer forming process of organic photoelectric conversion element SC-101 was changed as described below.

(Electron Transport Layer Forming Process)

Compound 1 described below in an amount of 10 mg was measured and dissolved in a mixed solvent of 0.25 ml of tetrafluoropropanol (TFPO) and 0.25 ml of 1-butanol to prepare a liquid which was coated to have a thickness of 20 nm, and it was kept in nitrogen ambient, in which vapor amount was controlled, at 120° C. for 30 minutes. Thus an electron transport layer was formed.

Organic Photoelectric Conversion Element SC-104

Organic photoelectric conversion element SC-104 was manufactured in the similar way to the preparation of the organic photoelectric conversion element SC-103 except that 10 mg of Compound 1 was measured and, sodium fluoride was added so as to be 6% by mass an n-type dopant concentration, and a liquid obtained by dissolving them in 0.5 ml of TFPO and 0.5 ml of 1-butanol was coated to form a layer via a spin coat method at 1,500 rpm, for 30 seconds, and then was kept at 120° C. for 30 minutes, thus an electron transport layer having a thickness of 10 nm.

Organic Photoelectric Conversion Elements SC-105 Through SC-109

Organic photoelectric conversion element SC-105 through 109 were manufactured in the similar way to the preparation of the organic photoelectric conversion element SC-104 except that the organic alkali metal salt to add to the electron transport layer was changed to those described in Table 1.

Organic Photoelectric Conversion Element SC-110

Organic photoelectric conversion element SC-110 was manufactured in the similar way to the preparation of the organic photoelectric conversion element SC-104 except that 10 mg Compound 1 was measured, calcium acetylacetonate $(Ca(C_5H_7O_2)_2)$ was added so as to be 6% by mass as an n-type dopant, and a liquid obtained by dissolving them in 1.0 ml of 1-butanol was coated at 1,500 rpm, for 30 seconds, and then was kept at 120° C. for 30 minutes, thus an electron transport layer having a thickness of 10 nm.

Organic Photoelectric Conversion Element SC-111

Organic photoelectric conversion element SC-111 was manufactured in the similar way to the preparation of the organic photoelectric conversion element SC-104 except that 10 mg of Compound 1 was measured and, $CH_3COOCs$ was added to be 1% by mass as an n-type dopant, and a liquid obtained by dissolving them in 0.5 ml of TFPO and 0.5 ml of 1-butanol was coated via a spin coat method at 3,000 rpm, for 30 seconds, and then kept at 120° C. for 30 minutes to form a layer, and then further a liquid dissolving 10 mg of $CH_3COOCs$ solely in 0.5 ml of TFPO was coated via a spin coat method at 1,500 rpm, for 30 seconds to form an electron transport layer having a total thickness of 15 nm.

Compounds used in each sample were described below.

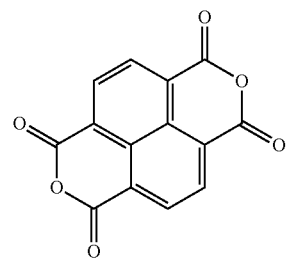

NTCDA

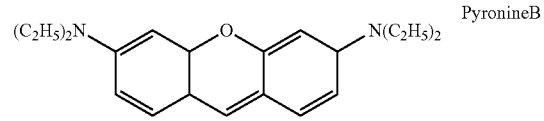

PyronineB

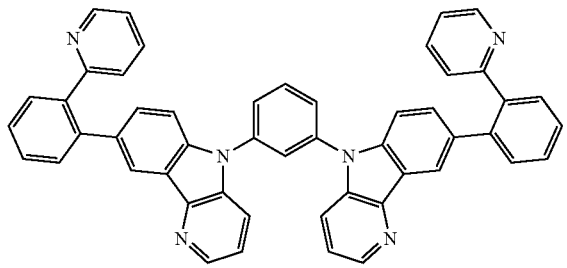

Compound 1

Measurement of Metal Concentration

Metal concentration of an alkali metal or an alkaline earth metal in the electron transport layer formed as described above was measured by the following way.

After a step of forming respective electron transport layer, measurement was conducted by employing dynamic secondary ion mass spectroscopy (Dynamic SIMS). Detail of Dynamic SIMS can be referred to a practical surface analysis secondary ion mass spectroscopy edited by the Surface Science Society of Japan (2001, Maruzen). Practically measurement was conducted under the following condition.

Apparatus: ADEPT1010, manufactured by Physical Electronics, Inc.
Primary ion: $O_2^-$
Primary ion energy: 5.0 keV
Primary ion current: 200 nA
Primary ion irradiation area: 600 μm
Secondary ion taking ratio: 25%
Secondary ion polarity: Positive
Detecting secondary ion species: $Cs^+$, $K^+$, $Na^+$ In case of Cs, Cs concentration in the electron transport layer was measured under the condition described above. Practically at first, Cs concentration (content) of the reference electron transport layer was detected by ICP Mass (Inductive Coupling Plasma Mass analysis), and the reference sample was subjected to Dynamic SIMS measurement, relative sensitivity coefficient was determined based on the intensity of the detected Cs ion, then Dynamic SIMS was measured as for an electron transport layer as practically employed, Cs concentration (content) in the sample was calculated by employing the signal intensity obtained by the measurement and the relative sensitivity coefficient obtained previously. As for the Cs concentration according to the invention, gradation of Cs concentration (concentration gradient) in depth direction of the electron transport layer was measured by conducting depth profile to detect Cs concentration of an electron transport layer in the thickness direction.

The similar measurement was conducted with reference to K concentration and Na concentration.

Metal concentration was measured for 15 to 85% depth of the electron transport layer, whether concentration gradient was observed or not observed was recorded.

Evaluation of Energy Conversion Characteristics of Organic Photoelectric Conversion Element Light of AM 1.5 G filter, having intensity of 100 mW/cm² was irradiated by a solar simulator to the organic photoelectric conversion element manufactured as described above, a mask having effective area was set as 4.0 mm² was superposed on the light receiving portion, and short-circuit current density Jsc (mA/cm²), open circuit voltage Voc (V) and fill factor FF were respectively measured. Energy conversion efficiency η (%) was calculated by the Formula 1, and FF value and photoelectric conversion efficiency value are shown in Table 1.

$$Jsc(mA/cm^2) \times Voc(V) \times FF = \eta(\%) \quad \text{Formula 1:}$$

Evaluation of Durability Against Temperature-Humidity Cycle

Change of temperature and humidity (−20° C. to 85° C., RH 85%) corresponding to temperature-humidity cycle test A-2 stipulated in JIS C8938 was conducted 10 cycles for the photoelectric conversion element manufactured as described above. The short-circuit current density Jsc (mA/cm²) was obtained from IV characteristics before and after the cycle test, and maintaining ratio (%) was calculated according to Formula 2 described below, with respect to each of four light receiving portions provided on the element, and their average was shown in Table 1, Maintaining ratio (%)=(photoelectric conversion efficiency after temperature-humidity cycle test)/(photoelectric conversion efficiency before temperature-humidity cycle test)×100   Formula 2:

The result is shown in Table 1.

TABLE 1

| No. | Electron Transport Layer | | Concentration gradient | FF (%) | Photoelectric conversion efficiency (%) | Maintaining ratio after Durability Test (%) | Remarks |
|---|---|---|---|---|---|---|---|
| SC-101 | LiF | None | — | 45.9 | 3.01 | 30 | Comparative sample |
| SC-102 | PyronineB | NTCDA | concentration gradient not observed | 42.6 | 0.84 | 32 | Comparative sample |
| SC-103 | Compound 1 | None | — | 30.6 | 1.51 | 31 | Comparative sample |
| SC-104 | Compound 1 | NaF | concentration gradient not observed | 36.8 | 2.06 | 87 | Inventive sample |
| SC-105 | Compound 1 | $CH_3COOCs$ | concentration gradient not observed | 58.2 | 2.98 | 93 | Inventive sample |
| SC-106 | Compound 1 | $CH_3(CH_2)_3COONa$ | concentration gradient not observed | 50.1 | 2.54 | 82 | Inventive sample |
| SC-107 | Compound 1 | $CH_3COONa$ | concentration gradient not observed | 50.9 | 2.23 | 80 | Inventive sample |
| SC-108 | Compound 1 | $CH_3COOK$ | concentration gradient not observed | 53.1 | 2.60 | 87 | Inventive sample |
| SC-109 | Compound 1 | $CH_3COOCa$ | concentration gradient not observed | 56.1 | 2.87 | 80 | Inventive sample |
| SC-110 | Compound 1 | $Ca(C_5H_7O_2)_2$ | concentration gradient not observed | 51.3 | 2.54 | 87 | Inventive sample |
| SC-111 | Compound 1 | $CH_3COOCs$ | concentration gradient observed | 67.4 | 3.54 | 96 | Inventive sample |

As shown in Table 1, when an alkali metal salt or an alkaline earth metal salt, or a respective complex their of is added to an electron transport layer, charge selectivity improves, and FF and photoelectric conversion efficiency are improved by virtue of reducing recombination of hole and electron. Further, layer strength is increased by addition of metal salt whereby peeling off of metal electrodes stored at high temperature is inhibited, and therefore storability (durability) of the element stored at high temperature is improved.

DESCRIPTION OF SYMBOLS

10: an organic photoelectric conversion element
11: a substrate
12: an anode
13: a cathode
14: a photoelectric conversion layer
14$i$: a layer containing a p-type semiconductor material and an n-type semiconductor material mixed with each other
14$n$: a layer singly composed of an n-type semiconductor material
14$p$: a layer singly composed of a p-type semiconductor material
17: a hole transport layer
18: an electron transport layer

The invention claimed is:

1. A bulk heterojunction organic photoelectric conversion element comprising:
   a first electrode;
   a second electrode;
   at least one photoelectric conversion layer between the first electrode and the second electrode; and
   at least one electron transport layer between the first electrode and the second electrode,
   wherein the electron transport layer contains a Compound 1 represented by the following formula and a salt of an alkali metal or an alkaline earth metal, or a complex of an alkali metal or an alkaline earth metal in an amount of 1.5 to 35% by mass of the electron transport layer,

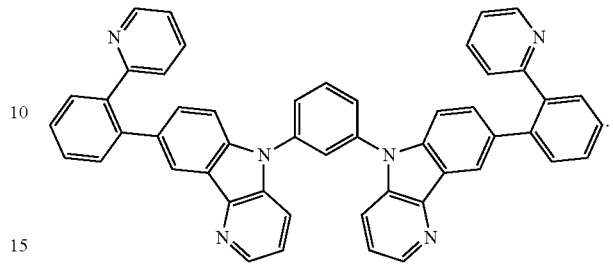

Compound 1

2. The organic photoelectric conversion element of claim 1, wherein concentration of the salt of the alkali metal or the alkaline earth metal or the complex thereof in the electron transport layer has continuous gradient in thickness direction of the electron transport layer.

3. The organic photoelectric conversion element of claim 1, wherein concentration of the salt of the alkali metal or the alkaline earth metal or the complex thereof in the electron transport layer is arranged so as to have higher concentration toward an electrode adjacent to the electron transport layer.

4. The organic photoelectric conversion element of claim 1, wherein the salt of the alkali metal or the alkaline earth metal is a salt of aliphatic carboxylic acid.

5. The organic photoelectric conversion element of claim 1, wherein the alkali metal or the alkaline earth metal is cesium, potassium or calcium.

6. The organic photoelectric conversion element of claim 1 wherein the electron transport layer is formed via a wet process.

* * * * *